US 6,739,189 B2

(12) United States Patent
Lee et al.

(10) Patent No.: US 6,739,189 B2
(45) Date of Patent: May 25, 2004

(54) MICRO STRUCTURE FOR VERTICAL DISPLACEMENT DETECTION AND FABRICATING METHOD THEREOF

(75) Inventors: Byeung-leul Lee, Kyungki-do (KR); Kyu-dong Jung, Kyungki-do (KR); Sang-woo Lee, Seoul (KR); Yong-chul Cho, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 45 days.

(21) Appl. No.: 10/121,666

(22) Filed: Apr. 15, 2002

(65) Prior Publication Data

US 2002/0158293 A1 Oct. 31, 2002

(30) Foreign Application Priority Data

Apr. 26, 2001 (JP) .......................... 2001-22675
Oct. 25, 2001 (JP) .......................... 2001-66023

(51) Int. Cl.[7] .......................... G01P 15/00; H01L 29/84
(52) U.S. Cl. .......................... 73/488; 257/415
(58) Field of Search .................. 73/488, 496, 514.01, 73/514.35, 514.36, 514.37, 514.38; 257/415, 417, 418, 419

(56) References Cited

U.S. PATENT DOCUMENTS 6,388,300 B1 * 5/2002 Kano et al. .................. 257/419

FOREIGN PATENT DOCUMENTS

KR 2000-0046474 A 7/2000

OTHER PUBLICATIONS

Ha et al., "A Area Variable Capacitive Microaccelerometer with Force–Balancing Electrodes", 1998 IEEE, Position Location and Navigation Symposium, pp. 146–151.*

* cited by examiner

*Primary Examiner*—Evan Pert
(74) *Attorney, Agent, or Firm*—Burns, Doane, Swecker & Mathis, L.L.P.

(57) ABSTRACT

Provided are a structure for detecting a vertical displacement and its manufacturing method. The structure for detecting a vertical displacement includes a body, an inertial mass floated over the body, a plurality of support beams extending from the inertial mass so as to suspend the inertial mass over the body, movable electrodes integrally formed with the inertial mass, and fixed electrodes floated over the body, each being positioned between the neighboring movable electrodes, wherein a vertical length of the movable electrode is different from a vertical length of the fixed electrode. Therefore, the structure and the electrodes can be simultaneously manufactured, thereby making the fabrication process simple. Also, it is possible to manufacture a three-axis accelerometer and a three-axis gyroscope on a single wafer by the same process, to be integrated as a six-axis inertial sensor.

11 Claims, 12 Drawing Sheets

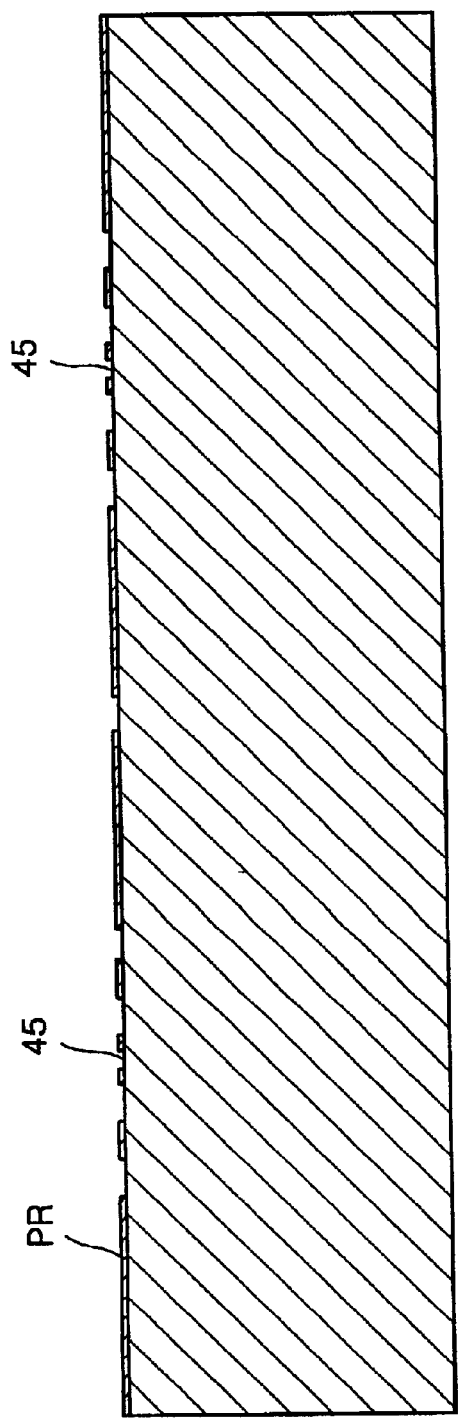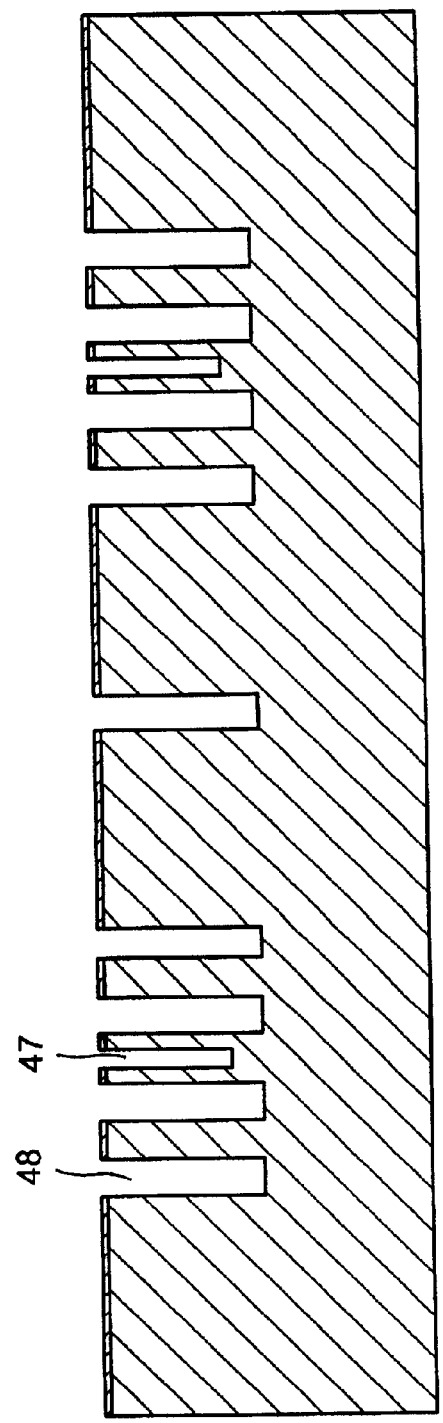

US 6,739,189 B2

MICRO STRUCTURE FOR VERTICAL DISPLACEMENT DETECTION AND FABRICATING METHOD THEREOF

Priority is claimed to Patent Application Numbers 1) 2001-22675 filed in Rep. of Korea on Apr. 26, 2001 and 2) 2001-66023 filed in Rep. of Korea on Oct. 25, 2001, herein incorporated by reference.

BACKGROUND OF THE INVENTION

1. Field of the Invention

The present invention relates to a structure for a vertical displacement and a method for fabricating the same, and more particularly to a MEMS silicon structure.

2. Description of the Related Art

Generally, a structure for the vertical displacement provides an upper electrode and a bottom electrode horizontally disposed and detects a change in a capacitance therebetween due to a vertical displacement.

For the fabrication of the structure, a plurality of patterning procedures must be conducted because the structure member and the electrodes cannot be manufactured at the same time. Also, to maintain a predetermined interval between the electrodes, there may be required a sacrificial layer or a layer attachment, which makes the fabrication complicated. Furthermore, to precisely detect the vertical displacement, the interval between electrodes must be small, which results in a stiction therebetween.

SUMMARY OF THE INVENTION

It is an object of the present invention to provide a structure for detecting a vertical displacement wherein the structure member and the electrodes are manufactured simultaneously, thereby simplifying the fabrication procedures and also the electrodes are disposed laterally, thereby being free from a stiction phenomenon.

The other object of the invention is to provide a fabrication method for the same.

To achieve the above objects of the invention, there is provided a structure for detecting a vertical displacement comprising a body, an inertial mass floated over the body, a plurality of support beams extending from the inertial mass so as to suspend the inertial mass over the body, movable electrodes integrally formed with the inertial mass, and fixed electrodes floated over the body, each being positioned between the neighboring movable electrodes, wherein a vertical length of the movable electrode is different from a vertical length of the fixed electrode.

In the case of using the support beams as torsional members, the inertial mass has different density between a first side portion thereof and a second side portion thereof so as to make a rotation centered about the support beams. Preferably, the vertical lengths of the movable electrodes are shorter than the vertical lengths of the fixed electrodes or vice versa.

In the case of using the support beams as bending members, the vertical lengths of the movable electrodes located at a first side portion of the inertial mass are longer than the vertical lengths of neighboring fixed electrodes, and the vertical lengths of the movable electrodes located at a second side portion of the inertial mass are shorter than the vertical lengths of neighboring fixed electrodes, the first and second side portions being oppositely positioned centered about the bending members.

Within the various embodiments, the body is made of a single crystal silicon wafer or of a SOI wafer including a silicon substrate, an insulating layer and a silicon layer, the inertial mass is fabricated by etching the silicon layer. When using a SOI wafer, the silicon substrate is made of single crystal silicon or epitaxial growth polysilicon.

Alternatively, the body can be made of a SOG wafer including glass and silicon layer, the inertial mass is fabricated by etching the silicon layer.

BRIEF DESCRIPTION OF THE DRAWINGS

The above objects and advantages of the present invention will become more apparent by describing in detail a preferred embodiment thereof with reference to the attached drawings in which:

FIGS. 12a–12f are cross-sectional view illustrating a fabrication method for the MEMS structure.

DETAILED DESCRIPTION OF THE INVENTION

Hereinafter, a structure for a vertical displacement and a fabrication method therefor of the present invention in accordance with preferred embodiments will be described with the attached drawings.

Figure 1:
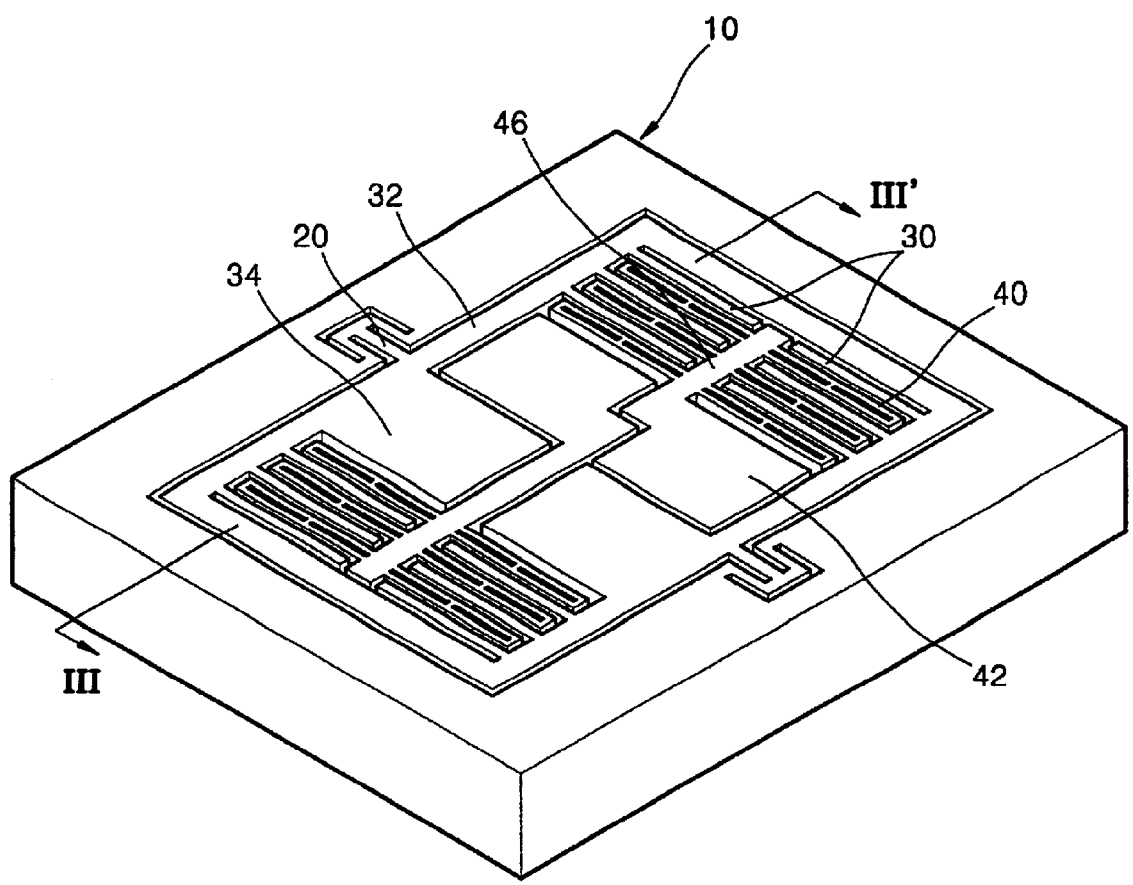
FIG. 1 is a perspective view of a MEMS structure for a vertical displacement in accordance with a first embodiment of the invention.
Figure 2:
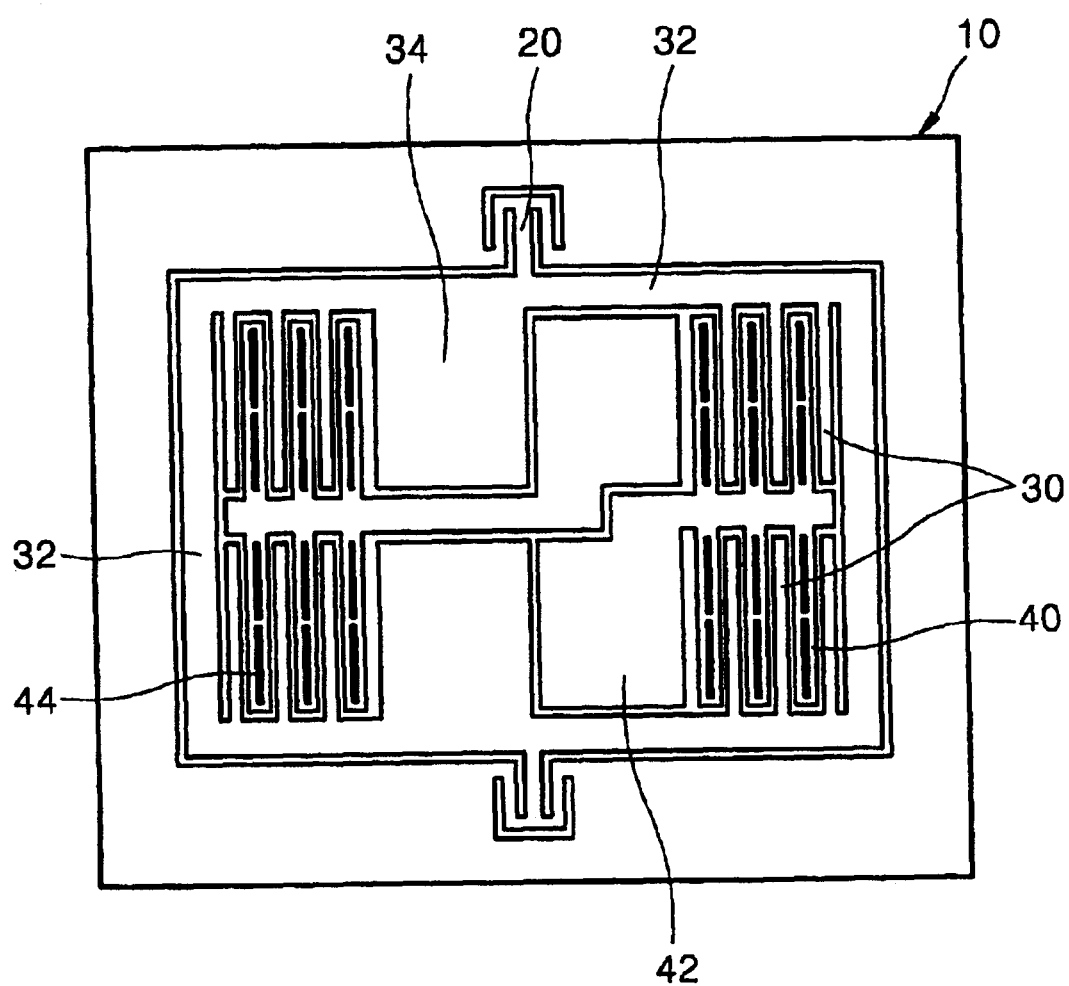
FIG. 2 is a plan view of the MEMS structure.
Figure 3:
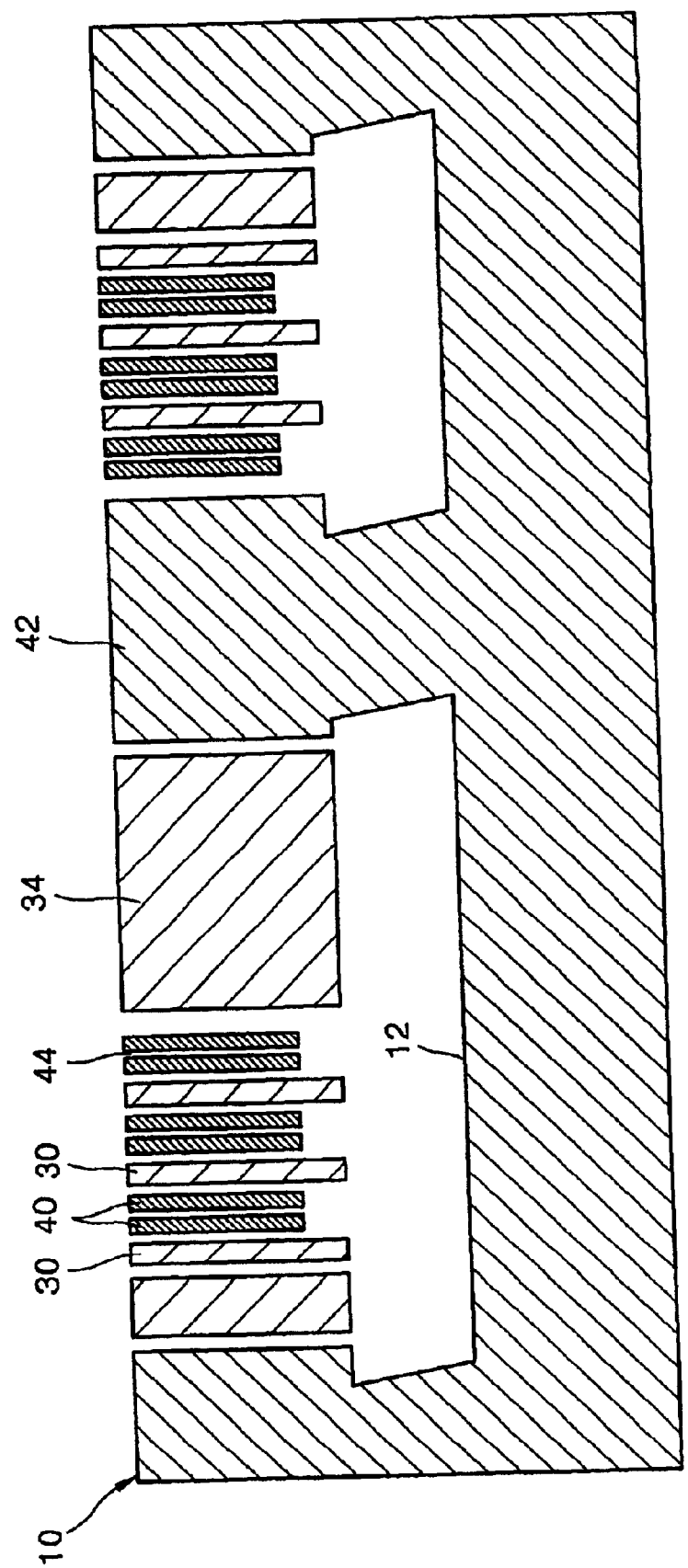
FIG. 3 is a cross-sectional view of a cut surface through III–III' shown in FIG. 1.

Referring to FIGS. 1 through 3, there is provided a rectangular frame 32 floated above a main body 10 made of single crystal silicon wafer. At opposing sides of the frame 32, torsional springs 20 are formed therefrom and extend outward so as to be connected to respective inner walls of the main body 10, thereby supporting the frame 32. The frame 32 is formed with an inertial mass 34 inwardly extending and movable electrodes 30. Between neighboring movable electrodes 30, fixed electrodes 40 are disposed and each formed with a trench 44 with a narrow opening. As shown in the figures, the movable and fixed electrodes 30 and 40 can have a shape of a comb. The fixed electrodes 40 are connected to a fixing anchor 42, via element 46, so as to be floated from the bottom of the main body 10. That is, the frame 32, the moving electrodes 30 and the inertial mass 34 are supported at the main body 10 through the torsional springs 20 while the fixed electrodes 40 being supported at the main body 10 through the anchor 42. The vertical length of the fixed electrode 40 is shorter than that of the movable electrode 30.

Figure 4A:
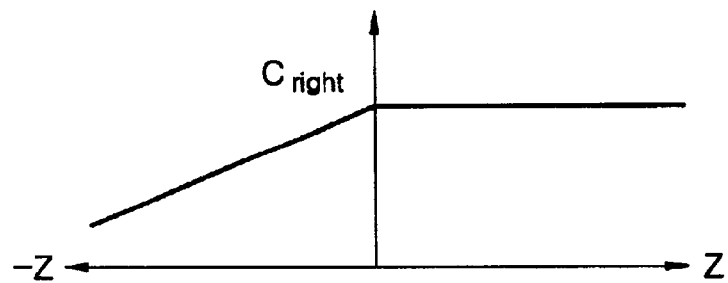
FIGS. 4a–4c are graphs illustrating a detection method for a vertical displacement of the MEMS structure.
Figure 4B:
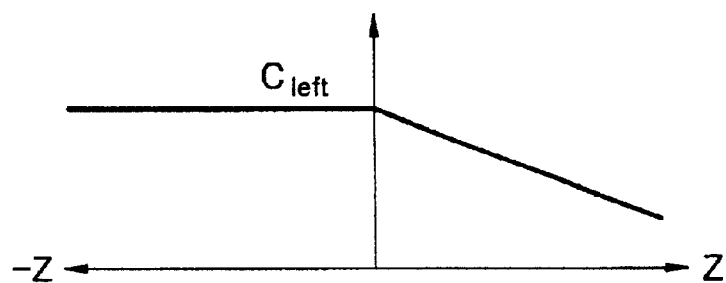
Figure 4C:
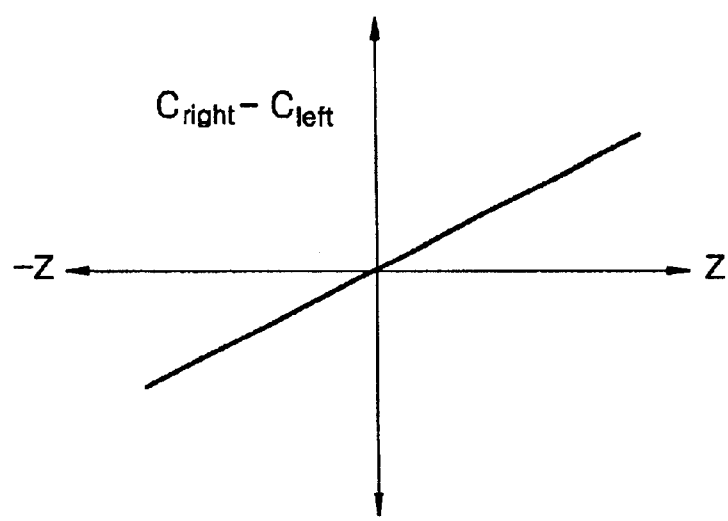

In accordance with the present invention, the vertical displacement can be detected when the movable electrodes 30 move slidably against the fixed electrodes 40 resulting in a change in a capacitance formed between the electrodes 30 and 40. Therefore, when the frame 32 rotates counter-clockwisely about the torsional spring 20, referring to FIGS. 4a and 4b, the capacitance $C_{left}$ being formed in left section decreases along with the vertical displacement as shown in plus Z direction of the graphs while the capacitance $C_{right}$ in the right section is maintained during a predetermined displacement distance. On the other hand, when the frame 32 turns clockwisely, referring to the minus Z direction of FIGS. 4a and 4b, the capacitance $C_{right}$ of the right section decreases along with the vertical displacement while the lefthand capacitance $C_{left}$ is maintained during a predetermined displacement distance. Accordingly as shown in FIG. 4c, the difference in capacitance $C_{right}-C_{left}$ varies linearly with the vertical displacement, thereby enabling the detection of the vertical displacement.

In above embodiment, the fixed electrode 40 is shorter than the movable electrode 30 in their vertical length, it is possible to make the fixed electrode 40 is longer than the movable electrode 30 in vertical length.

It is an advantage of the present invention that since the electrodes are aligned laterally, when the movable electrodes 30 move vertically relative to the fixed electrodes 40, there is no stiction phenomena therebetween.

Figure 5:
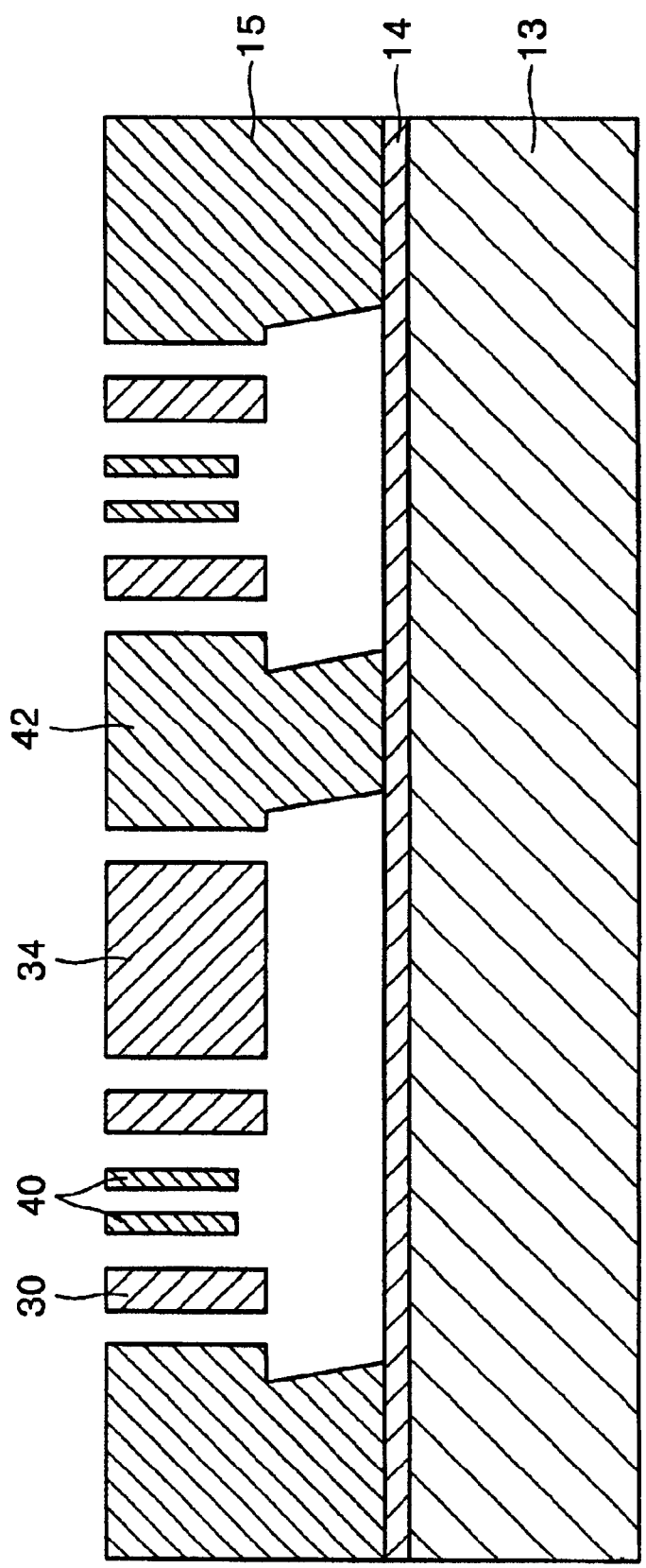
FIG. 5 shows a second embodiment of the structure shown in FIG. 3.

FIG. 5 shows another embodiment of the invention. An SOI (silicon on insulator) is used, and the substrate of the SOI preferably includes single-crystal silicon or epitaxially grown poly-silicon.

Referring to FIG. 5, the SOI wafer includes a substrate 13, an insulating layer 14 and a silicon layer 15 sequentially. The fixed and movable electrodes 40 and 30 and the inertial mass 34 are floated over the insulating layer 14, and the fixing anchor 42 is fixed onto the insulating layer 14.

Figure 6:
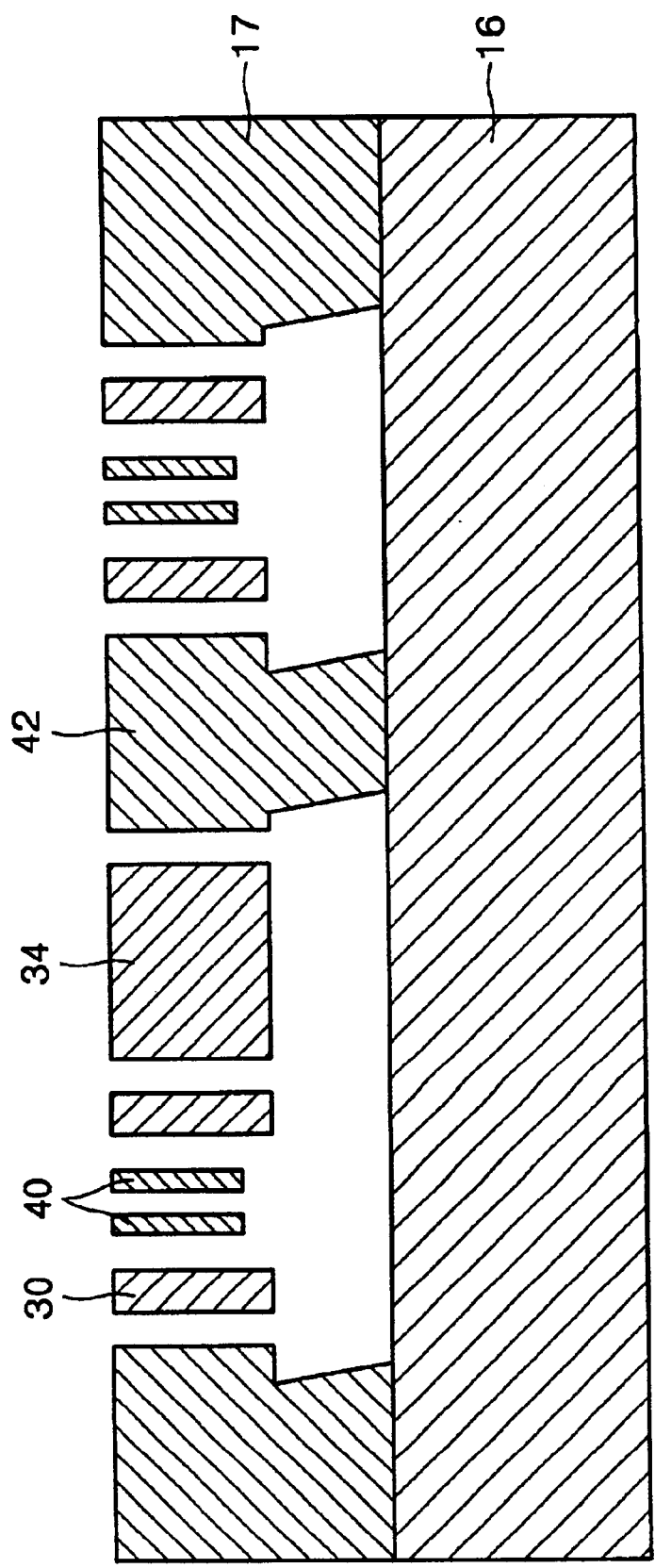
FIG. 6 shows a third embodiment of the structure shown in FIG. 3.

Referring to FIG. 6, a third embodiment of the invention is described, showing a case of using an SOG (silicon on glass) wafer. Elements having the same functions with the previous embodiments are given same numerals as well. A silicon layer 17 is anodic bonded onto a glass 16. As vertical moving structure, the fixed electrode 40, the movable electrode 30 and the inertial sensor 34 are floated over the glass 16, and the fixing anchor is fixed to the glass 16.

Accordingly with the second and third embodiments where SOI and SOG wafers are used, the structure for vertical displacement is insulated by the insulating layer 14 and the glass 16, so that the latter procedure for electrically insulating the fixed and movable electrodes 40 and 30 can be deleted.

Figure 7:
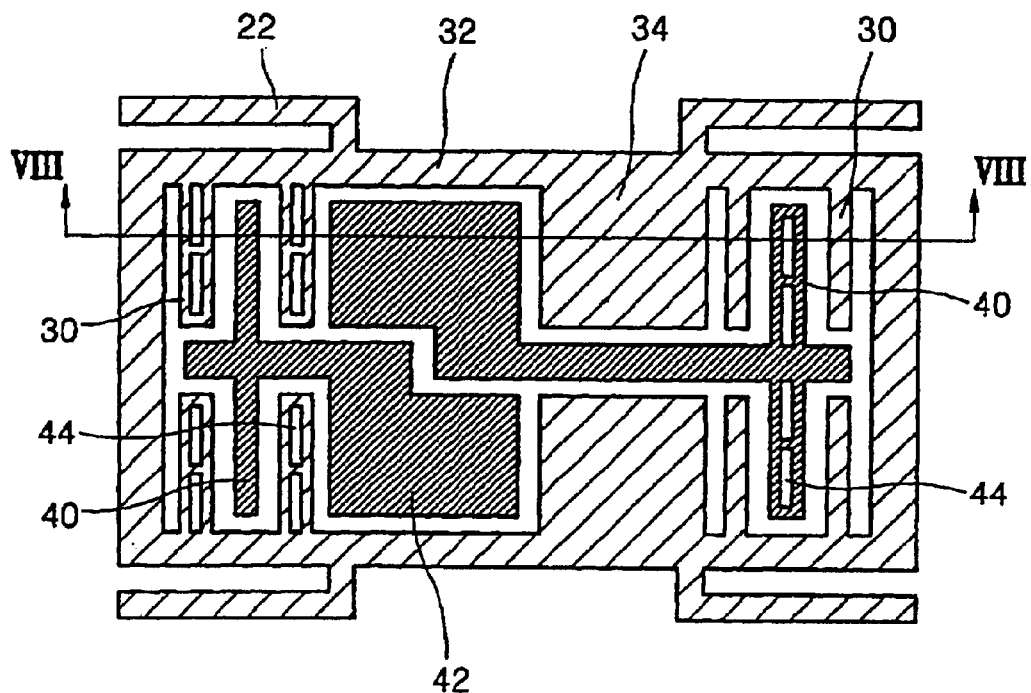
FIG. 7 is a plan view of a MEMS structure in accordance with a fourth embodiment of the invention.
Figure 8:
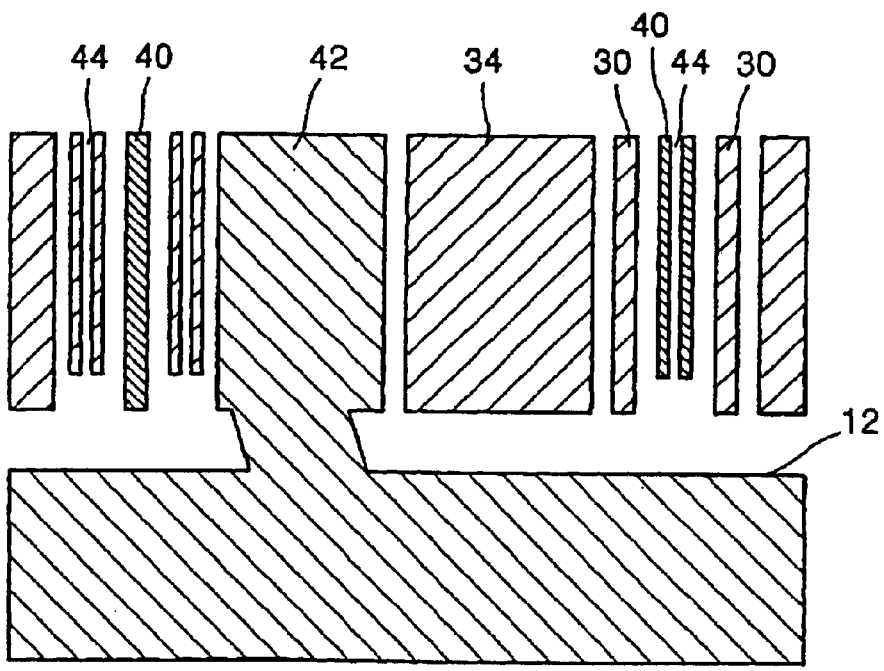
FIG. 8 is a cross-sectional view of the structure shown in FIG. 7 taken through line VIII–VIII'.

FIG. 7 shows a fourth embodiment of the invention and FIG. 8 is a cross-sectional view of FIG. 7 taken along the line VIII–VIII'. Elements having the same functions as those in the previous embodiments are given the same numerals.

Referring to FIGS. 7 and 8, a rectangular frame 32 is floated above a bottom 12 of a main body and is formed with a couple of bending springs 22 at both opposing sides thereof extending outward so as to be connected to inner walls of the main body. The bending springs 22 support the frame 32. The frame 32 is formed with an inertial mass 34 inwardly extending and movable electrodes 30. Between the movable electrodes 30 of the left-hand side (in FIGS. 7 and 8), trenches 44 are formed with narrow openings. As shown clearly in FIG. 8, the vertical length of the movable electrode 30 is shorter than that of the fixed electrode 40 disposed nearby. On the other hand, the fixed electrodes 40 at the right-hand side are formed with trenches 44 having narrow openings and are shorter than the movable electrodes in the vertical length thereof. The structure except the fixing anchor 42 is floated over the bottom 12 of the main body.

In accordance with the present invention, the vertical displacement can be detected when the movable electrodes 30 move slidably and vertically against the fixed electrodes 40 resulting in a change in a capacitance formed between the electrodes 30 and 40. Therefore, when the frame 32 upward moves in plus Z direction, referring to FIG. 8, the capacitance $C_{left}$ being formed in left section decreases along with the vertical displacement while the capacitance $C_{right}$ in the right section is maintained during a predetermined displacement distance. On the other hand, when the frame 32 downward moves in minus Z direction, the capacitance $C_{right}$ of the right section decreases along with the vertical displacement while the lefthand capacitance $C_{left}$ is maintained during a predetermined displacement distance. Accordingly as shown in FIG. 4c, the difference in capacitance $C_{right}-C_{left}$ varies linearly with the vertical displacement, thereby enabling the detection of the vertical displacement.

According to the present invention, the structure for vertical displacement detection can be implemented on SOI or SOG wafer.

Figure 9:
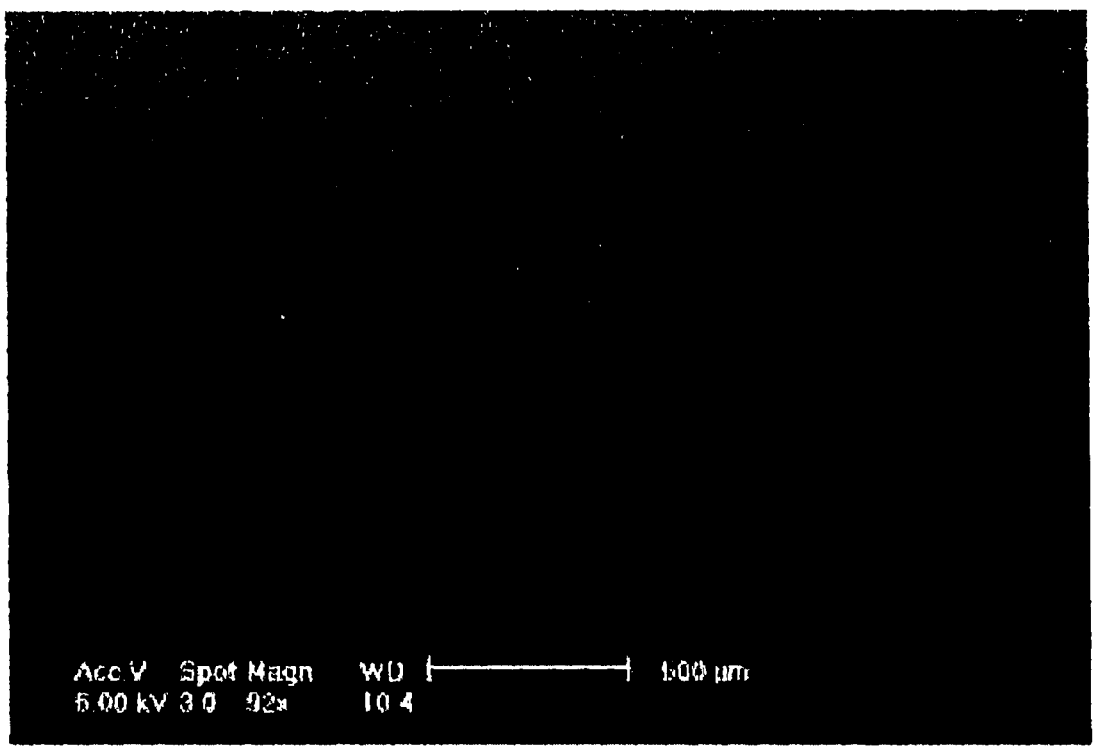
FIG. 9 is a SEM picture of an accelerometer using the structure of the invention.
Figure 10:
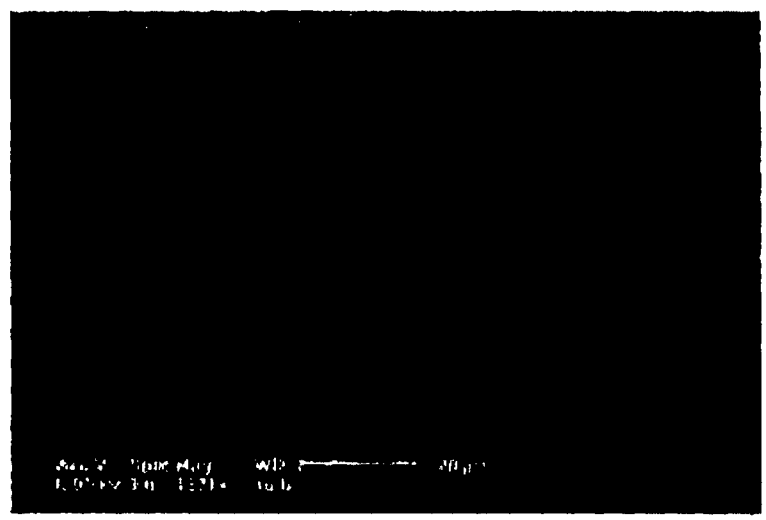
FIG. 10 is a picture showing an enlarged view of fixed and moving comb electrodes.
Figure 11:
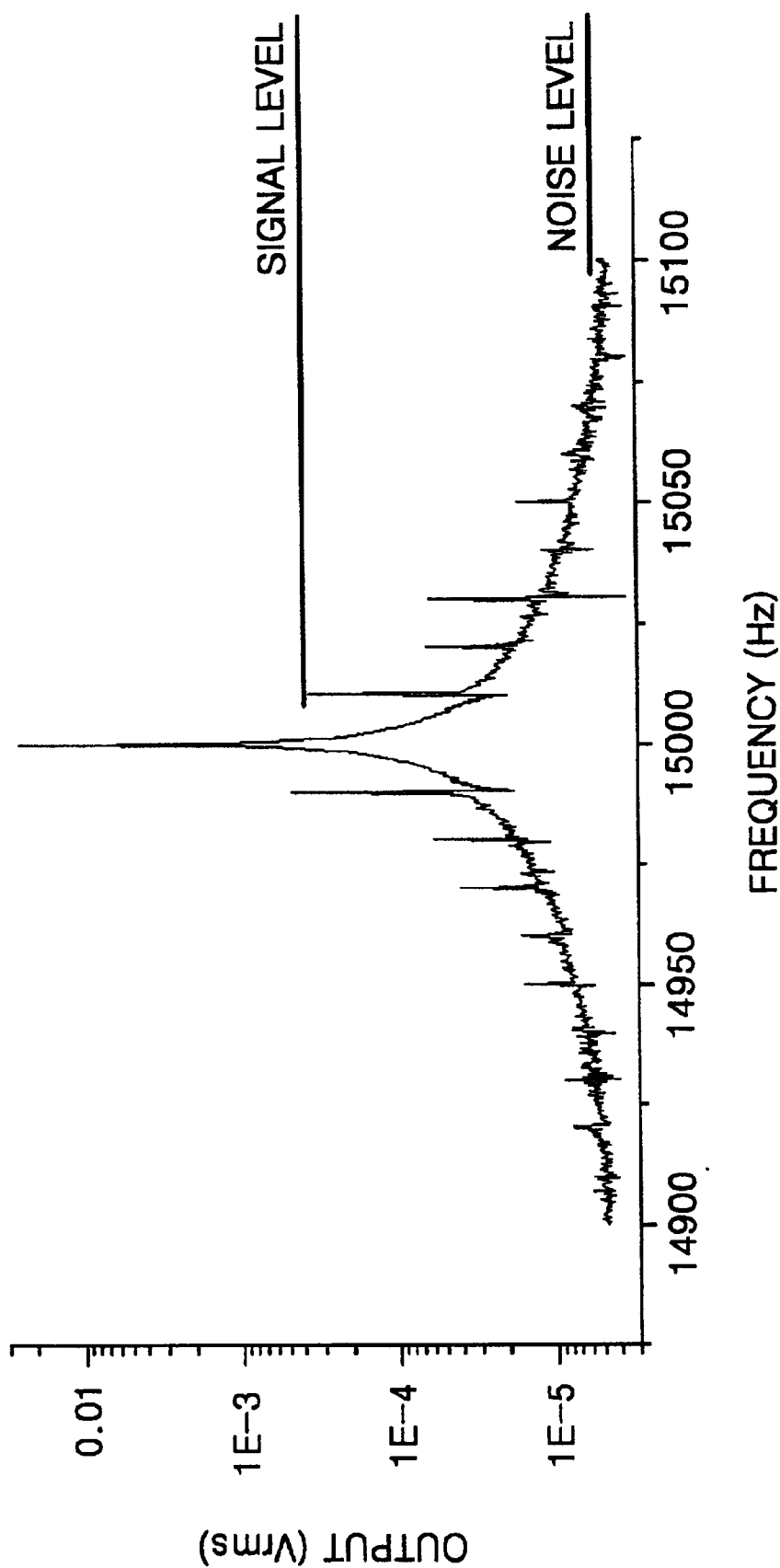
FIG. 11 is a graph showing an acceleration signal using the accelerometer of FIG. 9.

FIG. 9 is a SEM photograph of an accelerometer manufactured by using the micro structure for a vertical movement of the invention, FIG. 10 is an enlarged view of movable and fixed electrodes, and FIG. 11 is a graph showing a result of an acceleration signal detection.

The detection experiment is taken under an acceleration input of 1G peak-to-peak sinusoidal wave. Using 15 kHz of carrier signal, the performance of the accelerometer achieves a signal-to-noise ratio above 100:1 and 10 mG of noise equivalent acceleration.

As shown in FIG. 12a, masking is performed on a single crystal silicon wafer by using photoresist (PR). At this time, to make an electrode having a shorter depth, a narrow space 45 unmasked is formed thereon.

Next, to make a length difference between electrodes, RIE (Reactive Ion Etching) is conducted by using a high aspect ratio silicon etcher (not shown) utilizing Bosch process so as to make a narrow trench 47 and a wide trench 48 as shown in FIG. 12b. This result is due to RIE lag, the deeper etching depth on a wider trench.

Figure 12C:
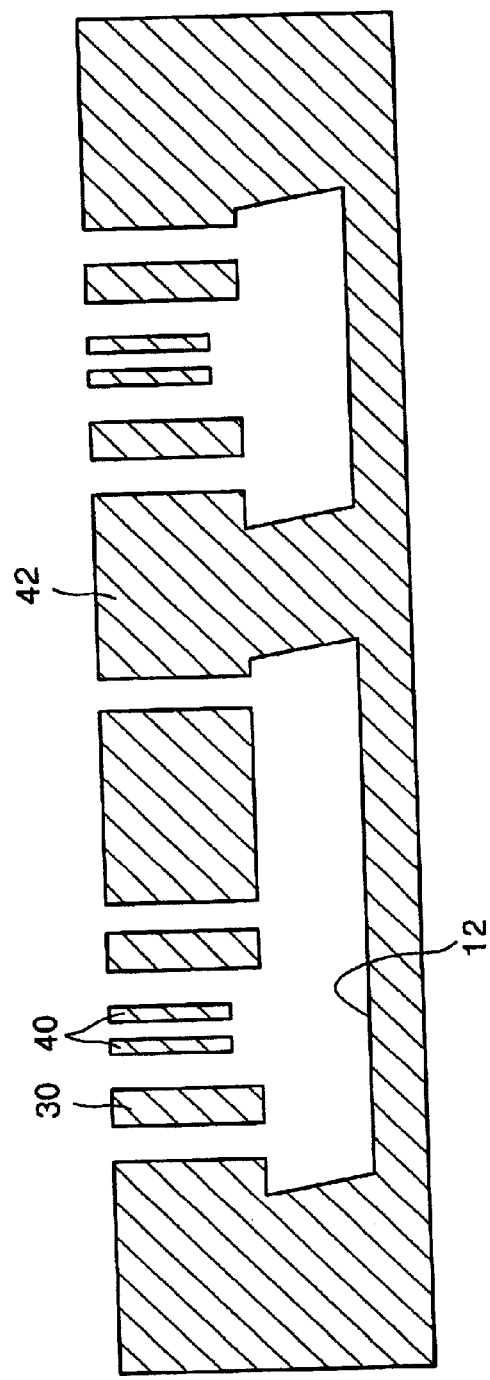
Figure 12D:
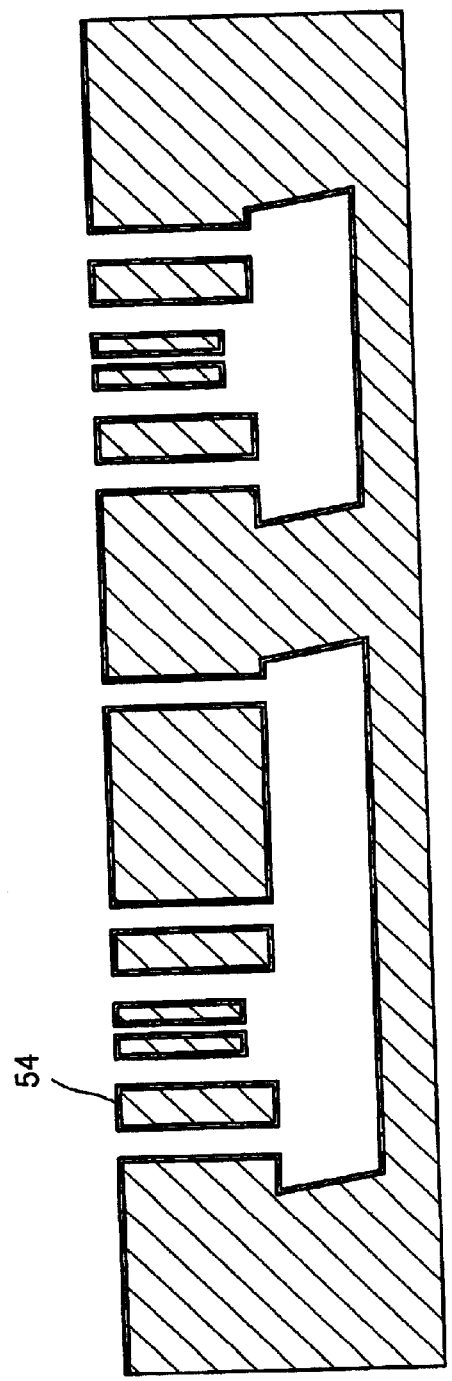

Next, the bottom of the trenches is released as shown in FIG. 12c so as to make the electrodes floated over the bottom 12. To release the underlying layer, SBM (Surface Bulk Machining) or SCREAM (Single Crystal Reactive Etching and Metallization) techniques can be used. The releasing starts from the bottom of the trench toward sideward so that an electrode 40 formed by a shallow trench is shorter than one 30 formed by a wider trench in their vertical length. The shorter electrodes pair 40 are connected each other by a predetermined distance and supported by an anchor 42.

Figure 12E:
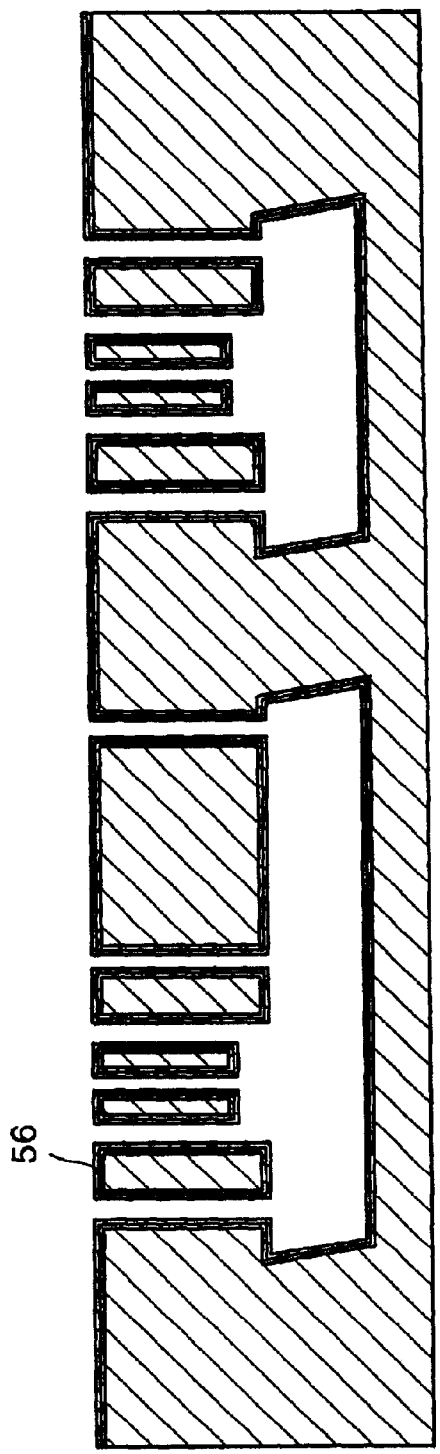
Figure 12F:
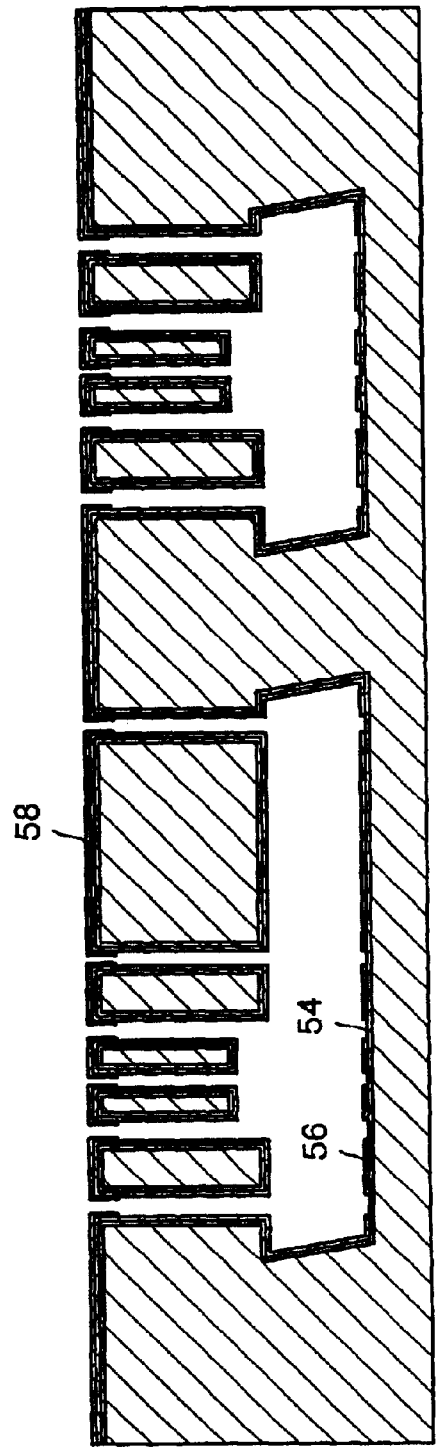

Next, to make insulation between electrodes, an insulating oxide film 54 is deposited onto the outer surface of the body and inside thereof and thereafter a poly-crystal silicon electrode 56 is deposited onto the oxide film as shown in FIG. 12e. Then, the bottom of the body is etched so as to be separated as shown in FIG. 12f. A metal electrode 58 is formed on the poly-crystal silicon electrode 56 at the surface of the body for wire bonding as shown in FIG. 12f.

As described above, there is no need to conduct a further patterning to form the electrodes so that the structure for a vertical displacement can be fabricated by a one time photo-etch process.

On the other hand, instead of a single crystal silicon wafer, SOI or SOG wafers can be used. In these cases, the bottom surface of the body is an insulating layer or glass so that the aforementioned additional insulating process is not required.

This makes the fabrication process simple and when used together with the conventional silicon fabrication process, it is possible to manufacture a structure for detecting lateral and vertical displacements within single wafer and furthermore to integrate a three-axis accelerometer and a three-axis gyroscope on a single wafer.

While the present invention has been particularly shown and described with reference to the preferred embodiment thereof, it will be understood by those skilled in the art that various changes in form and details may be made without departing from the spirit and scope of the invention as defined by the appended claims.

What is claimed is:

1. A structure for detecting a vertical displacement comprising:
   a body;
   an inertial mass floated over the body;
   a plurality of support beams extending from the inertial mass so as to suspend the inertial mass over the body;
   movable electrodes integrally formed with the inertial mass; and
   fixed electrodes floated over the body, each being positioned between the neighboring movable electrodes,
   wherein a vertical length of the movable electrode is different from a vertical length of the fixed electrode.

2. The structure as claimed in claim 1, wherein the support beams are torsional members.

3. The structure as claimed in claim 2, wherein the inertial mass has different density between a first side portion thereof and a second side portion thereof so as to make a rotation centered about the support beams.

4. The structure as claimed in claim 3, wherein the vertical lengths of the movable electrodes are shorter than the vertical lengths of the fixed electrodes.

5. The structure as claimed in claim 3, wherein the vertical lengths of the movable electrodes are longer than the vertical lengths of the fixed electrodes.

6. The structure as claimed in claim 1, wherein the support beams are bending members.

7. The structure as claimed in claim 6, wherein the vertical lengths of the movable electrodes located at a first side portion of the inertial mass are longer than the vertical lengths of neighboring fixed electrodes, and the vertical lengths of the movable electrodes located at a second side portion of the inertial mass are shorter than the vertical lengths of neighboring fixed electrodes, the first and second side portions being oppositely positioned centered about the bending members.

8. The structure as claimed in claim 1, wherein the body is made of single crystal silicon wafer.

9. The structure as claimed in claim 1, wherein the body is made of SOI wafer including a silicon substrate, an insulating layer and a silicon layer, the inertial mass is fabricated by etching the silicon layer.

10. The structure as claimed in claim 9, wherein the silicon substrate is made of single crystal silicon or epitaxial growth polysilicon.

11. The structure as claimed in claim 1, wherein the body is made of SOG wafer including glass and silicon layer, the inertial mass is fabricated by etching the silicon layer.

* * * * *